United States Patent
Nakagawa

(10) Patent No.: US 7,923,275 B2
(45) Date of Patent: Apr. 12, 2011

(54) SURFACE EMITTING LASER AND MANUFACTURING METHOD THEREOF

(75) Inventor: Shigeru Nakagawa, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/544,243

(22) Filed: Aug. 20, 2009

(65) Prior Publication Data

US 2009/0311812 A1 Dec. 17, 2009

Related U.S. Application Data

(62) Division of application No. 11/961,510, filed on Dec. 20, 2007, now abandoned.

(30) Foreign Application Priority Data

Dec. 20, 2006 (JP) ................................. 2006-343177

(51) Int. Cl.
H01L 21/00 (2006.01)
(52) U.S. Cl. ... 438/31; 438/706; 438/745; 257/E21.028; 257/E21.134
(58) Field of Classification Search ............... 438/31, 438/706, 745; 257/E21.028, E21.134
See application file for complete search history.

(56) References Cited

U.S. PATENT DOCUMENTS

| | | | |
|---|---|---|---|
| 5,493,577 A | 2/1996 | Choquette | |
| 6,306,672 B1 | 10/2001 | Kim | |
| 6,720,583 B2 | 4/2004 | Nunoue | |
| 7,573,931 B2 | 8/2009 | Tan | |

FOREIGN PATENT DOCUMENTS

| | | |
|---|---|---|
| JP | 4068587 | 3/1992 |
| JP | 5327121 | 12/1993 |
| JP | 11-097796 | 4/1999 |
| JP | 2000-353858 | 12/2000 |
| JP | 2001-358403 | 12/2001 |
| JP | 2002359434 | 12/2002 |
| JP | 2004260125 | 9/2004 |
| JP | 2005050990 | 2/2005 |
| WO | 2005-50901 | 6/2005 |

OTHER PUBLICATIONS

Hawkins, et al, "Reliability of Various Size Oxide Aperture VCSELs", IEEE 2002 ECT Conference (2002), pp. 540-550.

Lin, et al, "High Temperature Continuous-Wave Operation of 1.3 and 1.55 nm VCSELs with InP/Air-Gap DBRs", Journal of Selected Topics in Quantum Electronics, Oct./Nov. 2003, vol. 9, No. 5, pp. 1415-1421.

*Primary Examiner* — Michelle Estrada
(74) *Attorney, Agent, or Firm* — William Stock; Anne Vachon Dougherty

(57) ABSTRACT

A surface emitting laser includes a lower Bragg reflector, a resonator and an upper Bragg reflector. The resonator is provided on top of the lower Bragg reflector and includes an active layer, a lower semiconductor layer and an upper semiconductor layer. The upper Bragg reflector is provided on top of the resonator, and includes a plurality of semiconductor layers. In this surface emitting laser, the uppermost layer among the plurality of semiconductor layers in the lower Bragg reflector forms an air gap, which is larger than the aperture of the first insulating layer, while the lowermost layer among the plurality of semiconductor layers in the upper Bragg reflector forms an air gap, which is larger than the aperture of the second insulating layer.

6 Claims, 4 Drawing Sheets

SURFACE EMITTING LASER AND MANUFACTURING METHOD THEREOF

CROSS REFERENCE TO RELATED APPLICATIONS

This application is a divisional application of U.S. Ser. No. 11/961,510 filed Dec. 20, 2007 now abandoned.

FIELD OF THE INVENTION

The present invention generally relates to a semiconductor laser technology. In particular, the present invention relates to a structure of, and a manufacturing method of, a surface emitting laser.

BACKGROUND OF THE INVENTION

In recent years, as the processing speed of a computer has increased, it has been required that a large amount of data be transferred at a higher speed among a plurality of computers. In order to achieve such data transfer, for example, an electrical interconnection having been conventionally used for connecting elements in a high-end server tends to be replaced with an optical interconnection which operates at a higher speed.

In optical communications utilizing the optical interconnections, semiconductor lasers are often used. In particular, a surface emitting laser is employed in many cases rather than an edge emitting laser used in long-distance communications because the surface emitting laser is less expensive and consumes less power than the edge-emitting laser.

In order to meet the demand for such surface emitting lasers, companies in this field have been actively conducting research and development on improvement in a structure and manufacturing method of a surface emitting laser. As a result, for example, the following patent application publications have been issued as background arts.

An object of the invention according to Japanese Patent Application Laid-open Publication No. Hei 11-97796, is to facilitate the manufacture of a GaN-based group III-V nitride surface emitting laser. Disclosed are a group III-V compound semiconductor surface emitting laser and a manufacturing method thereof. This group III-V compound semiconductor surface emitting laser includes a cavity intervening between a pair of distributed Bragg reflectors on a semiconductor substrate. In this surface emitting laser, each of the distributed Bragg reflectors is formed by alternately stacking air layers and material layers each having a refractive index higher than that of the air layers.

An object of the invention according to Japanese Patent Application Laid-open Publication No. 2000-353858 is to provide a highly-reliable surface emitting laser with small total thickness, which is capable of oscillating at long wavelength and of a single lateral mode operation, and which is easy to manufacture. Disclosed are a surface emitting laser and a manufacturing method thereof. This surface emitting laser includes an upper multilayered semiconductor layer and a lower multilayered semiconductor layer, respectively over and under an active layer. In this surface emitting laser, the upper multilayered semiconductor layer and the lower upper multilayered semiconductor layer have a DBR structure of air gap layers/semiconductor layers and a DBR structure of air gap layers/semiconductor layers, respectively.

In Japanese Patent Application Laid-open Publication No. 2001-358403, disclosed is a surface emitting laser making it possible to efficiently excite a long-wavelength surface emitting laser by means of an optical pump, and also to monolithically manufacture DBRs each having a high reflectivity, and an active layer, on an InP substrate, without fusion bonding. In this surface emitting laser, when the refractive indices of semiconductors having the lowest refractive index and the highest refractive index among semiconductors composing the semiconductor distributed Bragg reflector are represented respectively by nD1 and nD2, and concurrently the refractive index of a carrier confinement layer is represented by nS, a relationship nD1<nS<nD2 is held.

As has been described above, the surface emitting laser has the advantages of being less expensive and of consuming lower power than the edge emitting laser. However, the surface emitting laser has a problem of having a life which is as long as or shorter than about one tenth of that of the edge emitting laser. In a case where a surface emitting laser is used for a connection between computer systems each simultaneously using a large number of elements, this problem becomes a particularly serious problem in terms of reliability of the systems.

SUMMARY OF THE INVENTION

Consequently, one of objects of the present invention is to provide a structure of a surface emitting laser having a longer life and being highly reliable, and to provide a manufacturing method of this surface emitting laser.

Disclosed is a surface emitting laser including a lower Bragg reflector, a resonator and an upper Bragg reflector. The lower Bragg reflector is provided on top of a semiconductor substrate, and includes a plurality of semiconductor layers. The resonator is provided on top of the lower Bragg reflector and includes an active layer, a lower semiconductor layer and an upper semiconductor layer. The lower semiconductor layer is provided under the active layer, and includes a first insulating layer having an aperture. The upper semiconductor layer is provided on top of the active layer, and includes a second insulating layer having an aperture. The upper Bragg reflector is provided on top of the resonator, and includes a plurality of semiconductor layers. In this surface emitting laser, the uppermost layer among the plurality of semiconductor layers in the lower Bragg reflector forms an air gap, which is larger than the aperture of the first insulating layer, while the lowermost layer among the plurality of semiconductor layers in the upper Bragg reflector forms an air gap, which is larger than the aperture of the second insulating layer. Additionally, disclosed is a manufacturing method of a surface emitting laser. This manufacturing method includes the steps of: forming a lower Bragg reflector, that is, forming a plurality of semiconductor layers on a semiconductor substrate; forming a resonator by performing the steps of, forming a lower semiconductor layer on top of the lower Bragg reflector, forming an active layer on top of the lower semiconductor layer, and then forming an upper semiconductor layer on top of the active layer; and forming an upper Bragg reflector, that is, forming a plurality of semiconductor layers. This manufacturing method further includes, after the above-described steps: forming etching grooves reaching the uppermost layer of the plurality of semiconductor layers in the lower Bragg reflector, that is, etching at least the plurality of semiconductor layers in the upper Bragg reflector, the upper semiconductor layer, the active layer, the lower semiconductor layer, and the uppermost layer of the plurality of semiconductor layers in the lower Bragg reflector; and forming air gaps in the uppermost layer among the plurality of semiconductor layers in the lower Bragg reflector, and in the lowermost layer among the plurality of semiconductor layers in the upper Bragg reflector, respectively, that is, etching the uppermost and lowermost layers in a lateral direction from the etching grooves; and forming insulating layers having apertures, which are smaller than the respective air gaps, that is, selectively oxidizing at least parts of the respective upper and lower semiconductor layers.

It should be noted that the above described summary of the invention does not list all of necessary characteristics of the present invention, and that sub-combinations of groups of these characteristics can also be included in the invention.

BRIEF DESCRIPTION OF THE DRAWINGS

For a more complete understanding of the present invention and the advantage thereof, reference is now made to the following description taken in conjunction with the accompanying drawings.

DETAILED DESCRIPTION OF THE PREFERRED EMBODIMENT

Figure 1:
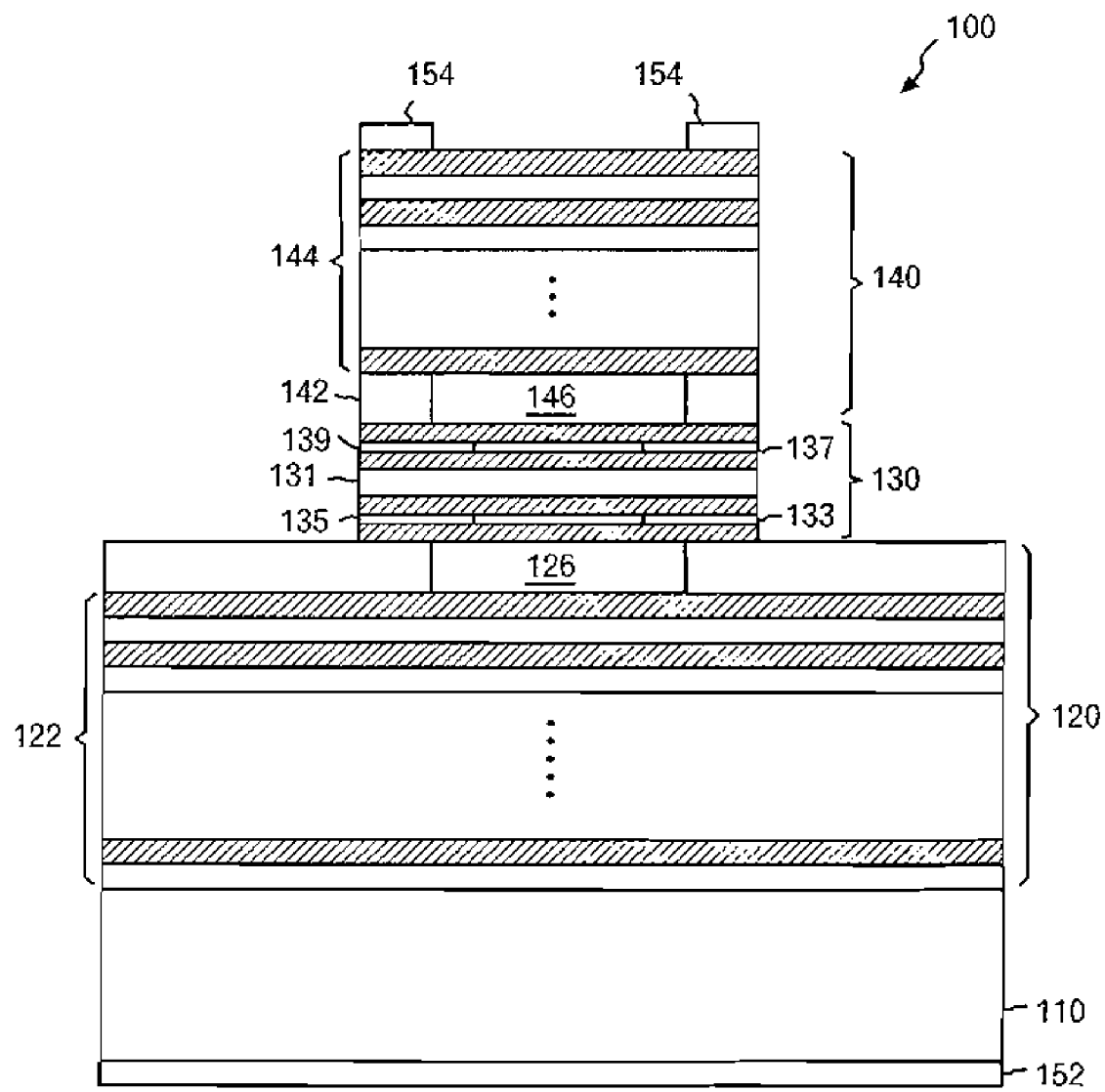
FIG. 1 is a view schematically representing a cross-sectional structure of a surface emitting laser in an embodiment of the present invention.

Although the best mode for carrying out the present invention will be described in detail based on the drawings, the following embodiment does not limit the invention according to the scope of claims, and all of combinations of characteristics described in the embodiment are not necessarily essential for the solving means of the invention.

Additionally, the present invention can be carried out in various different aspects, and should not be interpreted as being limited by contents described in the embodiment. Additionally, it should be noted that all of combinations of the characteristics described in the embodiment are not necessarily essential for the solving means of the invention. The same elements are denoted by the same reference numerals throughout the entire description of the embodiment.

Disclosed as the embodiment of the present invention are: a structure of a surface emitting laser including a lower Bragg reflector, a resonator and an upper Bragg reflector which are provided on top of a semiconductor substrate; and a manufacturing method of the surface emitting laser.

A resonator of the surface emitting laser in the embodiment of the present invention includes oxidized insulating layers, each of which has an aperture, over and under an active layer, respectively. Each of upper and lower Bragg reflectors of the surface emitting laser in the embodiment of the present invention includes semiconductor layers of plural kinds having different refractive indices.

The uppermost layer among the plurality of semiconductor layers included in the lower Bragg reflector of the surface emitting laser in the embodiment of the present invention forms an air gap, which is larger than the aperture of the oxidized insulating layer existing under the active layer of the resonator. Additionally, the lowermost layer among the plurality of semiconductor layers included in the upper Bragg reflectors of the surface emitting laser in the embodiment of the present invention forms an air gap, which is larger than the aperture of the oxidized insulating layer existing over the active layer of the resonator.

Here, it is known that degradation of a surface emitting laser chiefly depends on a magnitude of an operating current density (refer to, for example, 1: B. M. Hawkins et al., "Reliability of various size oxide aperture VCSELs", Electronic Components and Technology Conference (May, 2002)). Accordingly, a lifetime of a surface emitting laser becomes shorter as an operating current density of the surface emitting laser becomes larger.

It is also known that a transmission speed, which is a performance index of a semiconductor laser, chiefly depends on a relaxation oscillation frequency $f_R$ of optical response, the relaxation oscillation frequency $f_R$ being given by equation (1) shown below. Note that, in equation (1), $v_g$, $\alpha$, $q$, $L$, $\eta_i$, $J$ and $J_{th}$ signify a group velocity, a differential gain at a threshold current density, a unit charge, a length of an optical mode in a direction of current injection, an injection efficiency, a driving current density, and the threshold current density, respectively.

$$f_R = \frac{1}{2\pi}\sqrt{\frac{v_g \alpha}{qL}\eta_i(J-J_{th})} \qquad (E1)$$

Accordingly, in order to achieve a surface emitting laser having a long life while maintaining a performance level thereof, it is preferred that an operating current density thereof be reduced while having the relaxation oscillation frequency $f_R$ maintained at a high frequency. From equation (E1), it is understood that, in order to reduce the operating current density while obtaining a high value of the relaxation oscillation frequency $f_R$, (1) the length L of an optical mode in a direction of current injection should be decreased, (2) the threshold current density $J_{th}$ should be decreased, or (3) the differential gain a at the threshold current density $J_{th}$ should be increased.

In the surface emitting laser in the embodiment of the present invention, attention is given to that "(1) the length L of an optical mode in a direction of current injection should be decreased" in particular. Here, in the surface emitting laser, the length L of an optical mode in a direction of current injection is given by adding, to an optical length of the resonator, a penetration depth of an electromagnetic field in a Bragg reflector. In the surface emitting laser technology, it is a general practice that an optical length of a resonator is set to the minimum length (one wavelength of laser emitting light). Accordingly, in order to further decrease the length L of an optical mode in a direction of current injection, it is effective to decrease the penetration depth of an electromagnetic field in the Bragg reflector.

Moreover, a penetration depth of an electromagnetic field of a Bragg reflector is inversely proportional to a difference between refractive indices of a low-refractive-index layer and a high-refractive-index layer which compose the Bragg reflector. Consequently, in the embodiment of the present invention, minimization of the penetration depth of an electromagnetic field in the Bragg reflector is achieved through maximization of the difference in refractive index by providing an air gap in a layer having a low refractive index.

In addition, in the surface emitting laser in the embodiment of the present invention, the oxidized insulating layers having apertures are provided respectively over and under the active layer in the resonator. Moreover, each of the aforementioned air gaps is formed to have a radius larger than that of the corresponding oxidized insulating layer, and concurrently to cover the aperture. This makes it possible to achieve the maximum difference in refractive index for every optical mode with respect to the horizontal direction of the substrate when a laser oscillates. Also, the air gaps are thereby configured to minimize influence of scattered laser light from sides of the air gaps.

Note that, if a difference between refractive indices of a low-refractive-index layer and a high-refractive-index layer which compose a Bragg reflector is maximized by providing such an air gap, penetration of an electromagnetic field therein sharply attenuates in the air gap. Accordingly, in the surface emitting laser in the embodiment of the present invention, the desired object is achieved by providing only one layer of air gap located in the uppermost layer of the lower Bragg reflector and in the lowermost layer of the upper Bragg reflector, respectively.

Furthermore, not only that, in a case where more than one layer of air gap are provided, a resonator-like structure is formed between the air gaps inside of each of the lower and upper Bragg reflectors, whereby operations of the surface emitting laser may possibly become unstable due to laser oscillation occurring therein. Accordingly, it should be noted that, in the surface emitting laser in the embodiment of the present invention, providing only one layer of air gap inside the respective Bragg reflectors is preferable in achieving stable operations with a single wavelength.

(A Structure of the Surface Emitting Laser)

FIG. 1 is a view schematically representing a cross-sectional structure of a surface emitting laser 100 in the embodiment of the present invention. The structure of the surface emitting laser 100 shown in FIG. 1 includes a lower Bragg reflector 120, a resonator 130 and an upper Bragg reflector 140, on an n-type GaAs substrate 110. The surface emitting laser 100 includes ohmic electrodes 152 and 154 beneath the substrate 110 and on top of the upper Bragg reflector 140, respectively. Note that the surface emitting laser 100 in the embodiment of the present invention is configured to operate with a wavelength of 850 nm.

The lower distributed Bragg reflector 120 includes a plurality of semiconductor layers. Specifically, the lower distributed Bragg reflector 120 includes: a lamination 122 formed of 25.5 pairs of alternating high-refractive-index layers of n-type $Al_{0.2}Ga_{0.8}As$ and low-refractive-index layers of n-type $Al_{0.9}Ga_{0.1}As$; and a GaAs layer 124 which is the uppermost layer abutting the resonator 130. It should be noted that, in the surface emitting laser 100 in the embodiment of the present invention, the GaAs layer 124 includes an air gap 126. Additionally, in the embodiment of the present invention, the lamination 122 formed of the 25.5 pairs of alternating layers of n-type $Al_{0.2}Ga_{0.8}As$ and of n-type $Al_{0.9}Ga_{0.1}As$ is configured to have a thickness of 3358 nm, and the GaAs layer 124 is configured to have a thickness of 212 nm.

The resonator 130 includes an active layer 131, and semiconductor layers 133 and 137 provided beneath and above the active layer, respectively. The active layer 131 is composed of: a strained quantum well formed of $Al_{0.12}In_{0.22}Ga_{0.66}As$; and a barrier formed of $Al_{0.2}Ga_{0.8}As$. The lower semiconductor layer 133 includes: a clad layer 132 formed of $Al_{0.5}Ga_{0.5}As$; and an oxidized insulating layer 135 obtained by wet-oxidizing $Al_{0.98}Ga_{0.02}As$ and including an aperture 134. Likewise, the upper semiconductor layer 137 includes: a clad layer 136 formed of $Al_{0.5}Ga_{0.5}As$; and an oxidized insulating layer 139 obtained by wet-oxidizing $Al_{0.98}Ga_{0.02}As$ and including an aperture 138. Note that the resonator 130 of the surface emitting laser 100 in the embodiment of the present invention is configured to have a thickness of 259 nm.

The upper distributed Bragg reflector 140 includes a plurality of semiconductor layers as in the case with the lower distributed Bragg reflector 120. Specifically, the upper distributed Bragg reflector 140 includes: a GaAs layer 142 which is the uppermost layer abutting the resonator 130; and a lamination 144 formed of 15 pairs of alternating high-refractive index layers of p-type $Al_{0.2}Ga_{0.8}As$ and low-refractive index layers of p-type $Al_{0.9}Ga_{0.1}As$. It should be noted that, in the surface emitting laser 100 in the embodiment of the present invention, the GaAs layer 142 includes an air gap 146. Additionally, in the embodiment of the present invention, the GaAs layer 142 is configured to have a thickness of 212 nm, and the lamination 144 formed of alternating layers of p-type $Al_{0.2}Ga_{0.8}As$ and of p-type $Al_{0.9}Ga_{0.1}As$ is configured to have a thickness of 1962 nm.

Note that the reason why the numbers of pairs of alternately stacked layers of $Al_{0.2}Ga_{0.8}As$ and of $Al_{0.9}Ga_{0.1}As$ in the lower Bragg reflector 120 and in the upper Bragg reflector 140 are set to 25.5 and to 15, respectively, is to, while achieving a high average reflectivity of not less than 99.9%, obtain a sufficient output intensity of a laser light from the upper Bragg reflector from which the laser light is emitted.

Additionally, it should be noted that, as a characteristic of the surface emitting laser 100 in the embodiment of the present invention, the respective air gaps are formed only in the GaAs Layer 124 and GaAs Layer 144, which are the uppermost layer of the lower Bragg reflector 120 and the lowermost layer of the upper Bragg reflector 140, respectively. That is, air gaps are not formed inside the laminations 122 and 144 of alternating $Al_{0.2}Ga_{0.8}As$ and $Al_{0.9}Ga_{0.1}As$.

As another characteristic of the surface emitting laser 100 in the embodiment of the present invention, the oxidized insulating layers 135 and 139 including the apertures 134 and 138 are provided over and under the active layer 131 in the resonator 130, and the air gaps 126 and 146 are formed so as to have radiuses that are larger than the radiuses of these apertures 134 and 138 and so as to cover the apertures 134 and 138, so that the maximum difference between refractive indices for every optical mode with respect to the horizontal direction of the substrate when a laser is oscillated is allowed to be achieved, and so that influence of scattered laser light from side faces of the air gaps is minimized.

Specifically, in the embodiment of the present invention, diameters of the apertures 134 and 138 are 10 μm, and diameters of the air gaps 126 and 146 are 14 μm. When being viewed from above, it appears that the apertures are completely covered by the air gaps.

FIGS. 2A to 2H and 3A to 3D are views schematically representing a manufacturing method of the surface emitting laser 100 in the embodiment of the present invention.

(Preparation of the Substrate)

Figure 2:
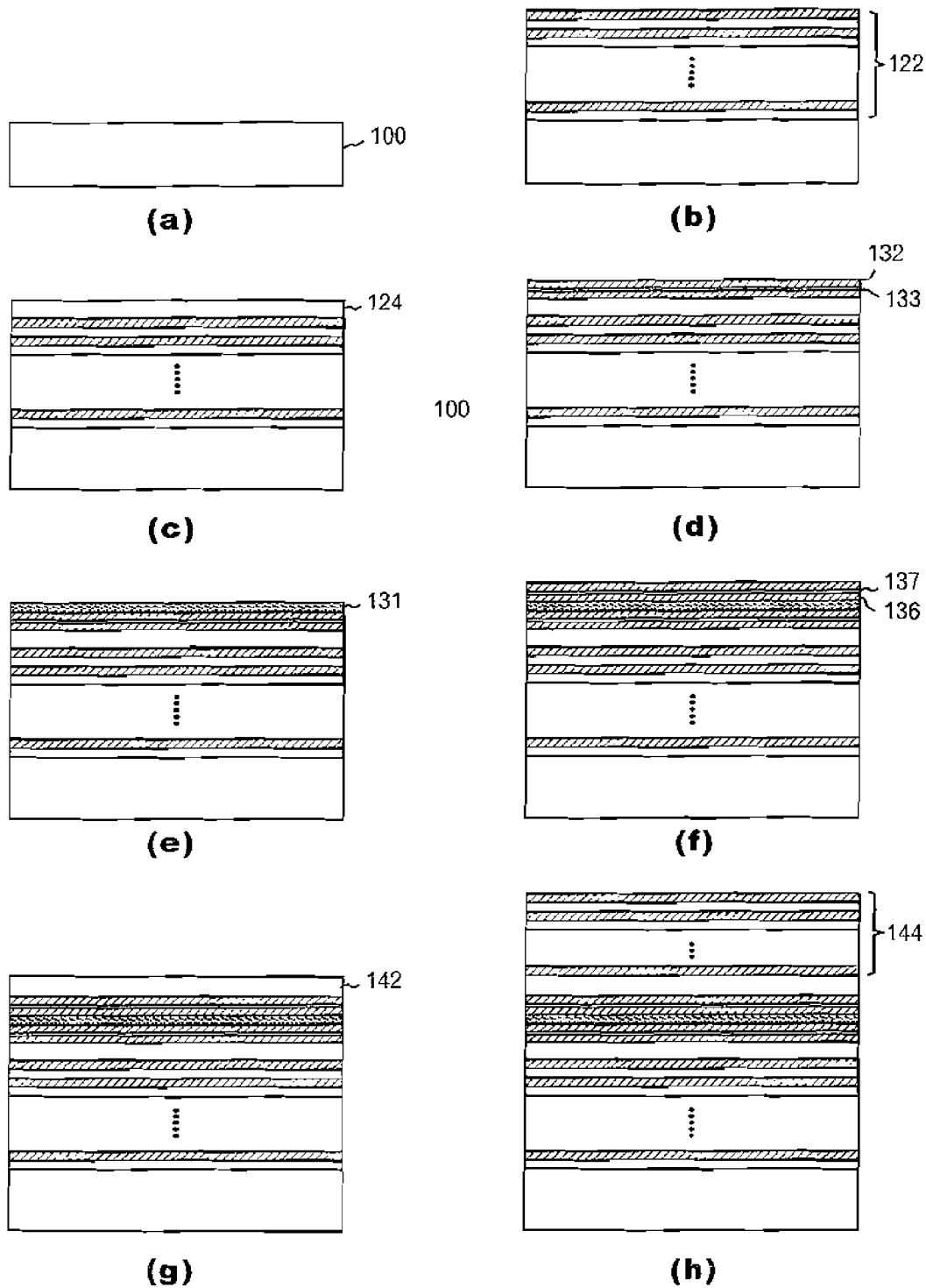
FIGS. 2A to 2H are views schematically representing a manufacturing method of the surface emitting laser in the embodiment of the present invention.

The manufacturing method of the surface emitting laser 100 in the embodiment of the present invention is firstly started with a step of preparing the GaAs substrate (FIG. 2A).

(Formation of the Lower Bragg Reflector)

Next, in order to form the lower Bragg reflector 120, the lamination 122 formed of the 25.5 pairs of alternating high-refractive index layers of n-type $Al_{0.2}Ga_{0.8}As$ and low-refractive index layers of n-type $Al_{0.9}Ga_{0.1}As$ is formed on the GaAs substrate 110 through crystal growth which is, for example, MBE (molecular-beam epitaxy) (FIG. 2B). Thereafter, the GaAs layer 124, which becomes the uppermost layer, is formed on top of the alternately stacked layers (FIG. 2C).

(Formation of the Resonator)

Next, in order to form the resonator 130, the lower semiconductor layer 133 composed of the clad layer 132 formed of $Al_{0.5}Ga_{0.5}As$, and the $Al_{0.98}Ga_{0.02}As$ layer 135 is formed (FIG. 2D). Next, the active layer 131 composed of the strained quantum well formed of $Al_{0.12}In_{0.22}Ga_{0.66}As$, and the barrier formed of $Al_{0.2}Ga_{0.8}As$ is formed (FIG. 2E). Thereafter, the upper semiconductor layer 137 composed of the clad layer 136 formed of $Al_{0.5}Ga_{0.5}As$, and the $Al_{0.98}Ga_{0.02}As$ layer 139 (FIG. 2F).

(Formation of the Upper Bragg Reflector)

Next, in order to form the upper Bragg reflector 140, the GaAs layer 142 which becomes the lowermost layer (FIG. 2G). Thereafter, the lamination 144 formed of the 15 pairs of alternating high-refractive index layers of p-type $Al_{0.2}Ga_{0.8}As$ and low-refractive index layers of p-type $Al_{0.9}Ga_{0.1}As$ is formed on the GaAs through crystal growth (FIG. 2H).

(Formation of the Air Gaps)

Figure 3:
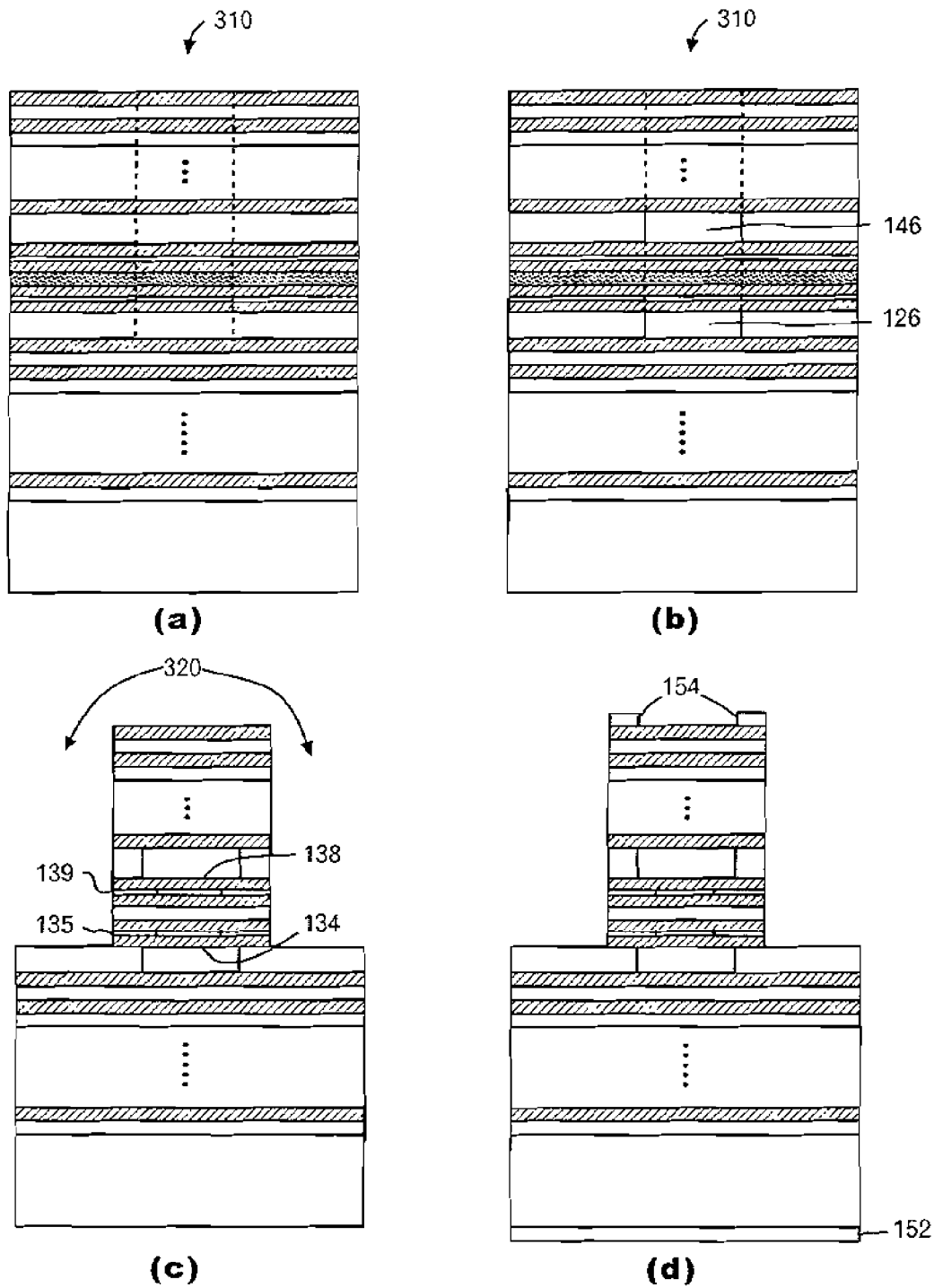
FIGS. 3A to 3D are views schematically representing the manufacturing method of the surface emitting laser in the embodiment of the present invention.

Next, the foregoing steps are followed by steps of FIGS. 3A to 3D, and, in order to form the air gaps, etching grooves 310 reaching the uppermost layer 124 in the lower Bragg reflector 120 are formed by applying dry etching (FIG. 3A). Thereafter, the air gaps 126 and 146 are formed by applying, to GaAs forming the uppermost layer 124 of the lower Bragg reflector 120 and the lowermost layer 142 of the upper Bragg reflector 140, selective wet etching in a lateral direction from the respective etching grooves 310 by using a mixed etchant of $NH_4OH$ and $H_2O_2$ (FIG. 3B)

(Formation of the Oxidized Insulating Layers)

Next, in order to form the oxidized insulating layers, the $Al_{0.98}Ga_{0.02}As$ layers 134 and 138 having oxidation rates faster than those of the other semiconductor layers are exposed by further applying etching to a periphery (320) of the surface emitting laser 100, and then are wet-oxidized so that the oxidized insulating layers 135 and 139 having the apertures 134 and 138, which are smaller than the air gaps 126 and 146 can be formed (FIG. 3C).

Incidentally, with respect to wet oxidation in the step of FIG. 3C, it has been known that an oxidation rate of AlGaAs becomes faster as a ratio of Al in AlGaAs becomes larger, and that the oxidation rate more abruptly becomes faster if the ratio of Al exceeds 95%. However, it has been known that, if the ratio of Al is set to 100% (that is, AlAs is used), reliability decreases although the wet-oxidation rate can be made the fastest. Consequently, in order to, while maintaining reliability, achieve selective wet-oxidation, the ratio of Al in the AlGaAs layers which become insulating layers through the stream-oxidation is set to 98% in the embodiment of the present invention.

(Formation of the Ohmic Electrodes)

Finally, the ohmic electrodes 152 and 154 are formed beneath the substrate 110, and above the upper Bragg reflector 140, respectively (FIG. 3D).

FIGS. 4A to 4E are views for explaining, more in detail, formation of the air gaps and the oxidized insulating layers in manufacture of the surface emitting laser (100) in the embodiment of the present invention. Note that FIG. 4A, FIG. 4B, and FIGS. 4C to 4E correspond to FIG. 3A, FIG. 3B and FIG. 3C, respectively.

Figure 4:
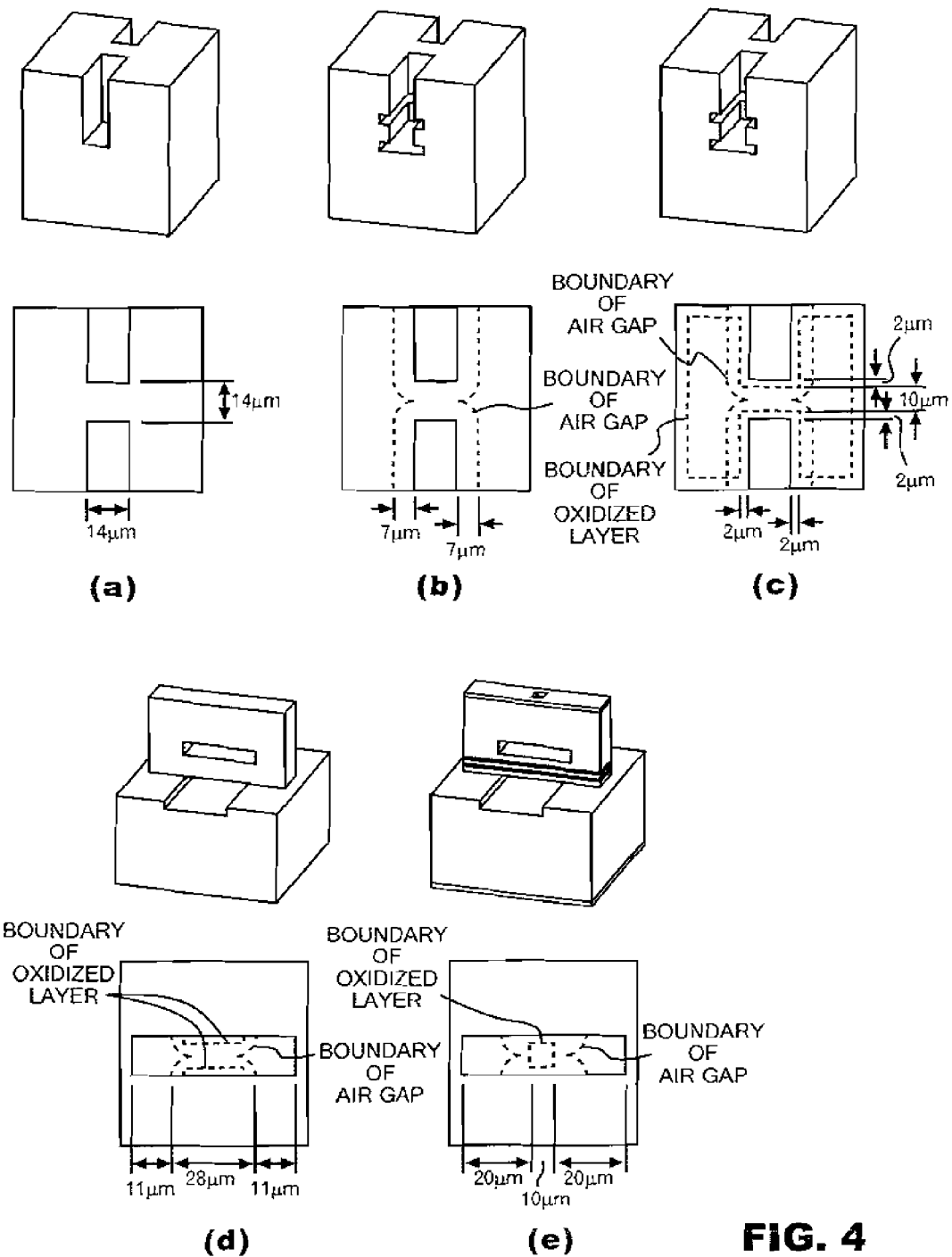
FIGS. 4A to 4E are views for explaining, more in detail, formation of air gaps and oxidized insulating layers in manufacture of the surface emitting laser in the embodiment of the present invention.

Firstly, the two etching grooves 310 each having a width, and a distance from the other etching groove 310 are equally 14 μm, which reach the uppermost layer 124 of the lower Bragg reflector 120, are formed by applying dry etching (FIG. 4A).

Next, the air gaps 126 and 146 are formed by applying, to GaAs forming the uppermost layer 124 in the lower Bragg reflector 120 and the lowermost layer 142 in the upper Bragg reflector 140, selective wet etching in a lateral direction from the etching grooves 310 only by 7 μm by using a mixed etchant of $NH_4OH$ and $H_2O_2$ (FIG. 4B).

Furthermore, from the etching grooves 310, the $Al_{0.98}Ga_{0.02}As$ layers 134 and 138 are selectively wet-oxidized only by 2 μm. Next, an island of 50 μm×14 μm as shown in FIG. 4D is formed by applying dry etching at least until the dry etching reaches the uppermost layer 124 of the lower Bragg reflector 120 (FIG. 4D).

Finally, the oxidized insulating layers 135 and 139 having the apertures 134 and 138, which are smaller than the air gaps 126 and 146 are formed by wet-oxidizing the island of 50 μm×14 μm only by 20 μm in the horizontal direction (FIG. 4E).

Incidentally, it has been known that, in a case where wet oxidation is again applied to an $Al_{0.98}Ga_{0.02}As$ layer to which wet oxidation has been already applied, an oxidation rate sharply decreases as compared to an oxidation rate in the firstly applied wet oxidation. Due to this characteristic, oxidation hardly progresses inwardly of the oxidized layers having been formed in the steps of FIG. 4D and before. It can be understood that patterns of the oxidized layers shown in FIG. 4E are formed as a result of that.

The structure of, and the manufacturing method of the surface emitting laser 100 in the embodiment of the present invention have been disclosed hereinabove. In the surface emitting laser 100 in the embodiment of the present invention, because the penetration depth of an electromagnetic field into each of the Bragg reflectors is set to the minimum, high-speed operations can be performed even with a low driving current density, and accordingly, reliability can be maintained even when the surface emitting laser 100 is operated at a high speed. Additionally, lower power consumption is achieved by thus lowering a driving current density.

It is apparent to those skilled in the art who have read this description that a variety of alterations and improvements can be added to the abovementioned embodiment. For example, although a combination of an n-type GaAs substrate, the lower Bragg reflector using n-type semiconductors, and the upper Bragg reflector using p-type semiconductors is adopted in the embodiment of the present invention, it is also possible to adopt a combination of a p-type GaAs substrate, the lower Bragg reflector using p-type semiconductors, and the upper Bragg reflector using n-type semiconductors.

Additionally, in each of the above described combinations, the n-type GaAs substrate or the p-type GaAs substrate may be replaced with an insulating GaAs substrate. In a case of adopting such an insulating substrate, it is favorable that, in order to secure an electric current path, the lower ohmic electrode be formed in a location on top of the lower Bragg reflector, the location being in a circumference of the island of the resonator. It should be noted that embodiments obtained by adding such alterations or improvements thereto can obviously be also included in the technical scope of the present invention.

What is claimed is:

1. A manufacturing method of a surface emitting laser comprising the steps of:

forming a lower Bragg reflector by forming a plurality of semiconductor layers on top of a semiconductor substrate comprising alternately stacked layers of a first semiconductor and layers of a second semiconductor and an uppermost layer formed of a third semiconductor;

forming a resonator by performing the steps of forming a lower semiconductor layer on top of the lower Bragg reflector, forming an active layer on top of the lower semiconductor layer, and forming an upper semiconductor layer on top of the active layer;

forming an upper Bragg reflector by forming a plurality of semiconductor layers comprising a lowermost layer formed of the third semiconductor and alternately stacked layers of the first semiconductor and layers of the second semiconductor;

forming etching grooves reaching the uppermost layer of the plurality of semiconductor layers of the lower Bragg reflector by etching at least the plurality of semiconductor layers in the upper Bragg reflector, the upper semiconductor layer, the active layer, and the lower semiconductor layer; and forming air gaps in the uppermost layer among the plurality of semiconductor layers in the lower Bragg reflector and in the lowermost layer among the plurality of semiconductor layers of the upper Bragg reflector, respectively, by etching the uppermost and lowermost layers in a lateral direction from the etching grooves; and forming insulating layers having apertures, which are smaller than the respective air gaps, by selectively oxidizing at least parts of the respective upper and lower semiconductor layers, wherein the step of forming the air gaps comprises the step of wet-etching selectively only to the third semiconductor.

2. The method according to claim 1, wherein the step of forming the etching grooves is performed by dry etching.

3. A manufacturing method of a surface emitting laser comprising the steps of:

forming a lower Bragg reflector by forming a plurality of semiconductor layers on top of a semiconductor substrate comprising alternately stacked layers of a first semiconductor and layers of a second semiconductor and an uppermost layer formed of a third semiconductor;

forming a resonator by performing the steps of forming a lower semiconductor layer on top of the lower Bragg reflector, forming an active layer on top of the lower semiconductor layer, and forming an upper semiconductor layer on top of the active layer;

forming an upper Bragg reflector by forming a plurality of semiconductor layers comprising a lowermost layer formed of the third semiconductor and alternately stacked layers of the first semiconductor and layers of the second semiconductor;

forming etching grooves reaching the uppermost layer of the plurality of semiconductor layers of the lower Bragg reflector by etching at least the plurality of semiconductor layers in the upper Bragg reflector, the upper semiconductor layer, the active layer, and the lower semiconductor layer; and forming air gaps in the uppermost layer among the plurality of semiconductor layers in the lower Bragg reflector and in the lowermost layer among the plurality of semiconductor layers of the upper Bragg reflector, respectively, by etching the uppermost and lowermost layers in a lateral direction from the etching grooves; and forming insulating layers having apertures, which are smaller than the respective air gaps, by selectively oxidizing at least parts of the respective upper and lower semiconductor layers, wherein the first semiconductor, the second semiconductor, and the third semiconductor are $Al_{0.2}Ga_{0.8}As$, $Al_{0.9}Ga_{0.1}As$, and GaAs, respectively and wherein the step of forming the air gaps comprises the step of selectively wet-etching, by using a mixed etchant of $NH_4OH$ and $H_2O_2$, only to the third semiconductor that is GaAs.

4. The method according to claim 1, wherein the step of selectively oxidizing the upper and lower semiconductor layers comprises the steps of:

etching the upper and lower semiconductor layers so that peripheries of the upper and lower semiconductor layers are exposed; and selectively oxidizing the exposed upper and lower semiconductor layers from a lateral direction.

5. The method according to claim 4, wherein the step of selectively oxidizing the upper and lower semiconductor layers comprises the step of applying selective wet oxidation from a lateral direction to the exposed upper and lower semiconductor layers.

6. The method according to claim 1, wherein ohmic electrodes are formed beneath the substrate and above the upper Bragg reflector, respectively.

* * * * *